United States Patent [19]

Brunin et al.

[11] 4,008,389
[45] Feb. 15, 1977

[54] APPARATUS FOR CHECKING THE OPERATION OF CONTROL CIRCUITS

[75] Inventors: Jean-Pierre Brunin, Belfort; Jean-Marc Thomas, Valdoie, both of France

[73] Assignee: Compagnie Honeywell Bull (Societe Ananyme), Paris, France

[22] Filed: Oct. 3, 1975

[21] Appl. No.: 619,251

Related U.S. Application Data

[63] Continuation-in-part of Ser. No. 503,114, Sept. 4, 1974, abandoned.

[30] Foreign Application Priority Data

Sept. 5, 1973 France .............................. 73.32061

[52] U.S. Cl. ...................................... 235/153 AS
[51] Int. Cl.² ......................................... G06F 11/00
[58] Field of Search ........... 235/153 AS; 340/172.5

[56] References Cited
UNITED STATES PATENTS

| | | | |
|---|---|---|---|
| 3,140,470 | 7/1964 | Deerfield | 235/153 AS |
| 3,287,698 | 11/1966 | Sapino | 235/153 AS |
| 3,496,547 | 2/1970 | Gorril et al. | 235/153 AS |
| 3,539,786 | 11/1970 | Raehpour | 235/153 AS |
| 3,560,926 | 2/1971 | Mrkvicka | 235/153 AS |

*Primary Examiner*—Charles E. Atkinson
*Attorney, Agent, or Firm*—Lowe, King, Price & Markva

[57] ABSTRACT

The disclosure describes apparatus for checking the operation of control circuits of the type used to actuate the hammers of a printer. A first gating matrix is addressed by a selector so that the control circuits are operated in groups during a plurality of sub-cycles of operation. Detectors which generate an error signal in response to the erroneous operation of each control circuit are connected to the gates of a second gating matrix arranged in the same manner as the first gating matrix. The selector also addresses the second gating matrix so that the detectors which generate error signals can be identified in an error register connected to the second gating matrix.

8 Claims, 14 Drawing Figures

FIG.3

|  | SC0 | | SC1 | | T₁ | SC13 | | SC15 | | SC16 | | SC17 | | T2 | T48 SC752 | |
|---|---|---|---|---|---|---|---|---|---|---|---|---|---|---|---|---|
|  | M | K | M | K | | M | K | M | K | M | K | M | K | | M | K |
| M1 | 0 | 0 | 11 | 9 | | 15 | 13 | 5 | 5 | 0 | 1 | 11 | 10 | | 0 | 47 |
| M2 | 16 | 13 | 27 | 22 | | 31 | 26 | 21 | 18 | 16 | 14 | 27 | 23 | | 16 | 60 |
| M3 | 32 | 26 | 43 | 35 | | 47 | 39 | 37 | 31 | 32 | 27 | 43 | 36 | | 32 | 73 |
| M4 | 48 | 39 | 59 | 48 | | 63 | 52 | 53 | 44 | 48 | 40 | 59 | 49 | | 48 | 86 |
| M5 | 64 | 52 | 75 | 61 | | 79 | 65 | 69 | 57 | 64 | 53 | 75 | 62 | | 64 | 99 |
| M6 | 80 | 65 | 91 | 74 | | 95 | 78 | 85 | 70 | 80 | 66 | 91 | 75 | | 80 | 112 |
| M7 | 96 | 78 | 107 | 87 | | 111 | 91 | 101 | 83 | 96 | 79 | 107 | 88 | | 96 | 125 |
| M8 | 112 | 91 | 123 | 100 | | 127 | 104 | 117 | 96 | 112 | 92 | 123 | 101 | | 112 | 138 |
| M9 | 128 | 104 | 139 | 113 | | 143 | 117 | 133 | 109 | 128 | 105 | 139 | 114 | | 128 | 152 |
| M10 | 144 | 117 | 155 | 126 | | 159 | 130 | 149 | 122 | 144 | 118 | 155 | 127 | | 144 | 165 |

FIG.6

HAMMER ORDER OF SUB-CYCLES (1 cycle = T)

| | | | | | | | | | | |
|---|---|---|---|---|---|---|---|---|---|---|
| SC0  | 0  | 16 | 32 | 48 | 64 | 80 | 96  | 112 | 128 | 144 |
| SC1  | 11 | 27 | 43 | 59 | 75 | 91 | 107 | 123 | 139 | 155 |
| SC2  |    |    |    |    |    |    |    |     |     |     |
| SC3  |    |    |    |    |    |    |    |     |     |     |
| SC4  |    |    |    |    |    |    |    |     |     |     |
| SC5  |    |    |    |    |    |    |    |     |     |     |
| SC6  |    |    |    |    |    |    |    |     |     |     |
| SC7  |    |    |    |    |    |    |    |     |     |     |
| SC8  |    |    |    |    |    |    |    |     |     |     |
| SC9  |    |    |    |    |    |    |    |     |     |     |
| SC10 |    |    |    |    |    |    |    |     |     |     |
| SC11 |    |    |    |    |    |    |    |     |     |     |
| SC12 |    |    |    |    |    |    |    |     |     |     |
| SC13 | 15 | 31 | 47 | 63 | 79 | 95 | 111 | 127 | 143 | 159 |
| SC14 |    |    |    |    |    |    |    |     |     |     |
| SC15 | 5  | 21 | 37 | 53 | 69 | 85 | 101 | 117 | 133 | 149 |

FIG.7

1 cycle = T

| | | | | | | | | | | |
|---|---|---|---|---|---|---|---|---|---|---|
| SC0  | 0  | 13 | 26 | 39 | 52 | 65 | 78 | 91  | 104 | 117 |
| SC1  | 9  | 22 | 35 | 48 | 61 | 74 | 87 | 100 | 113 | 126 |
| SC2  | 5  |    |    |    |    |    |    |     |     | 122 |
|      | 1  |    |    |    |    |    |    |     |     |     |
| SC13 | 13 | 26 | 39 | 52 | 65 | 78 | 91 | 104 | 117 | 130 |
| SC14 | 9  |    |    |    |    |    |    |     |     | 126 |
| SC15 | 5  | 18 | 31 | 44 | 57 | 70 | 83 | 96  | 109 | 122 |

APPARATUS FOR CHECKING THE OPERATION OF CONTROL CIRCUITS

RELATED APPLICATION

This is a continuation-in-part of U.S. Application Ser. No. 503,114, entitled "Apparatus For Checking The Operation Of Control Circuits", filed Sept. 4, 1974, and now abandoned, in the names of the present applicants.

BACKGROUND AND SUMMARY OF THE INVENTION

The present invention relates to an arrangement for checking the operation of control circuits and is more particularly applicable to printers which have a linear character support.

At the present time, printers which have a linear character support are often preferred to drum printers because of the higher standard of print which they give, despite the fact that the printing control arrangements for them are more complicated.

In linear character support printers, the characters succeed one another opposite print hammers in an order which depends on their respective positions, whereas in drum printers, a single, repeated character is situated in front of all print hammers at a given moment. Linear character support printers require greater control complexity due to the size of the memory needed to memorize the characters which each of the hammers can strike as a function of time and due to the extensiveness of the addressing circuitry associated with the memory means.

In most printers, the complexity is increased further because the pitch of the characters (the distance between them) is different from the pitch of the print hammers. The result of this difference is that, at any given moment, only a certain number of hammers coincide with characters on the belt, this number depending on the total number of characters and on the ratio between the pitch of the characters and the pitch of the hammers. It is therefore possible to formulate a law which governs the way in which the hammer/character coincidences follow one another cyclically until all the characters have coincided with all the hammers.

To clarify the following text, a cycle is defined as the time T which elapses between two characters which follow one another on the belt coinciding with the same hammer. A sub-cycle is defined as the interval of time separating two series of simultaneous coincidences between hammers and characters.

In printers having a linear character support which moves at a constant speed past a row of N hammers that are actuated by strike amplifiers, it is desired that there should be on the one hand k simultaneous, cyclically repeated coincidences between characters and hammers during a succession of sub-cycles, and on the other hand that in the course of m consecutive sub-cycles, each of the N hammers should coincide once with a character, m being the number of sub-cycles in a cycle and being equal to N/k. Furthermore, it is necessary that each hammer which coincides with a character at the beginning of a given sub-cycle in a cycle should coincide with the next character on the support during the corresponding sub-cycle in the next cycle. In such a system, in order to print a predetermined character at a predetermined position, the sub-cycle ms is selected during which the predetermined character is lined-up in front of the predetermined position. During the selected sub-cycle ms, k amplifiers associated with k hammers are lined up with characters, kc being the amplifier associated with the hammer located at the predetermined position. If amplifier kc is energized during sub-cycle ms, the proper character will be printed in the proper position. The selection can be achieved by using a control matrix having m rows (one for each of the m sub-cycles) and k columns (one for each of the k amplifiers and hammers lined-up with characters during each sub-cycle). By selecting the proper row and column and energizing the amplifier corresponding to the intersection of the selected row and column, the proper print hammer can be made to strike the described character.

Print control arrangements which meet the requirements defined above are known. One such arrangement is described in a French patent application No. 73,09686 entitled "An Arrangement for Controlling Print Hammers For a Printer" which was filed on Mar. 19, 1973 in the names of JEAN-PIERRE BRUNIN and JEAN-JACQUES PIERRE ELTGEN.

Once strike orders have been given to a series of strike amplifiers for coinciding hammers and the hammers in question have printed, it is important to check whether the amplifiers have in fact operated the appropriate hammers. Accordingly, each amplifier is fitted with an error detector for generating an error signal in response to erroneous operation. If an error signal is detected, a checking device organized according to the principles of the control matrix can be used to locate the defective amplifier.

The invention can be used for checking the operation of N control circuits each including a detector for generating an error signal in response to erroneous operation. The control circuits are divided into $m$ groups with $k$ control circuits in each group. N gates pass the error signals when enabled. Each detector is connected to a different one of the gates so that the gates are divided into $m$ groups with $k$ gates in each group. First selection means individually enables different ones of the $m$ groups of control circuits and simultaneously enables the gates connected to the detectors of the enabled control circuits during $m$ sub-cycles of operation so that any error signals generated by the detectors are transmitted by the enabled gates. Second selection means select for operation during each sub-cycle from 0 to $k$ control circuits. Error indicator means receive any error signals transmitted by the gate means so that the erroneous operation of control circuits can be recorded.

The control arrangement according to the invention can be used to control a printer having a linear character support which moves at constant speed past a row of N hammers the spacing of which is different from that of the characters. The hammer-strike amplifiers are provided with detectors for detecting operating errors, which make it possible to detect whether an amplifier has in fact operated after having received an order from the strike-control device.

In accordance with another feature of the invention, the arrangement is characterised in that it comprises:
a sub-cycle counter associated with a decoder having $m$ outputs
an error indicator circuit
an error register
an error detection matrix having $m$ rows and $k$ columns, that is to say N locations, which are connected to the N detectors for detecting errors on the part of the strike amplifiers, each of its $m$ rows being connected to one of the $m$ outputs of the decoder, and each of its $k$ columns being connected on the one hand to a location in the error register and on the other hand to the error indicator circuit via an OR circuit, the error register also being connected to the outputs of the sub-cycle counter. These connections as a whole are so arranged that, when an error is detected by the matrix in the ith row and the jth column where $0 \leq i \leq m$-$l$, the error indicator circuit indicates $0 \leq j \leq k$-$1$ that one of the N amplifiers is not operating and the error register records the values of $i$ and $j$.

DESCRIPTION OF THE DRAWINGS

Other features and advantages of the invention will become apparent from the following description which is given as a non-limiting example, and with reference to the accompanying FIGURES in which:

FIG. 1b is a schematic, perspective view of the apparatus illustrated in FIG. 1a;

FIG. 3 is a partial table of the coincidences of characters with the hammers of the tape printing machine, at the specified times the hammers hit the characters;

FIGS. 6 and 7 are matrix tables describing the order in which the characters to be printed are addressed in the line memory, and the printable characters in the memory which give the image of the tape;

DESCRIPTION OF THE PREFERRED EMBODIMENT

The invention will be better understood if one recalls the principle on which the print-control logic circuitry is constructed and operates, in a printer which has a linear character support, and in particular in a printer having a type-carrying belt.

It is known that endless type-carrying belts have a certain number of character-bearing tongues (or fingers) (480 under current practice) which are grouped into a certain number of identical sets of characters (generally eight or ten). This belt passes in linear fashion before a group of N hammers, a print-support, and an anvil.

To simplify the explanation, the example used will be a belt containing four hundred and eight characters which are split up into ten identical sets of forty-eight characters and a printer having one hundred and sixty hammers which are likewise split up into ten sets of sixteen hammers.

To prevent mis-prints, the pitch of the hammers (the distance between them) is different from and less than the pitch of the characters (the distance between fingers). Thus, at any given moment only a certain number of hammers coincide with characters.

Since the belt moves past the hammers at a constant speed, the time separating the coincidences of two characters which follow one another on the belt with the same hammer may be termed cycle T. Also defined are sub-cycles SC, which are the intervals of time separating two successive strikes by two hammers, the number of which is the same as that of the hammers making up a set (sixteen in the case selected) and which correspond to the different coincidences of the hammers in a set with certain characters.

Because there is one coincidence per sub-cycle and per set of hammers, there are ten simultaneous coincidences in the course of a sub-cycle.

Since the occurrences described above are repeated in identical form from one cycle to the next and from one print line to the next, all that will be considered in what follows are the sixteen sub-cycles SC0 to SC15 in one cycle T.

So that the way in which the print arrangement according to the invention operates may be better understood, it is useful to summarize the structure and operation of the print control device with which it is associated. This device includes a type-carrying band.

Figure 1A:
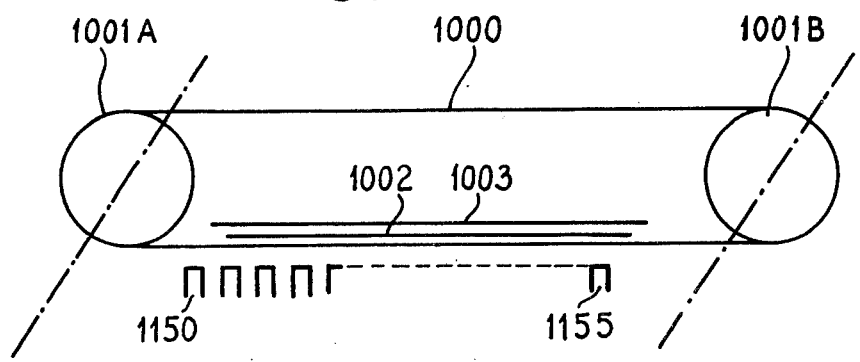
FIG. 1a is a top, schematic view of moving tape and print hammers suitable for use in connection with the present invention.
Figure 1B:
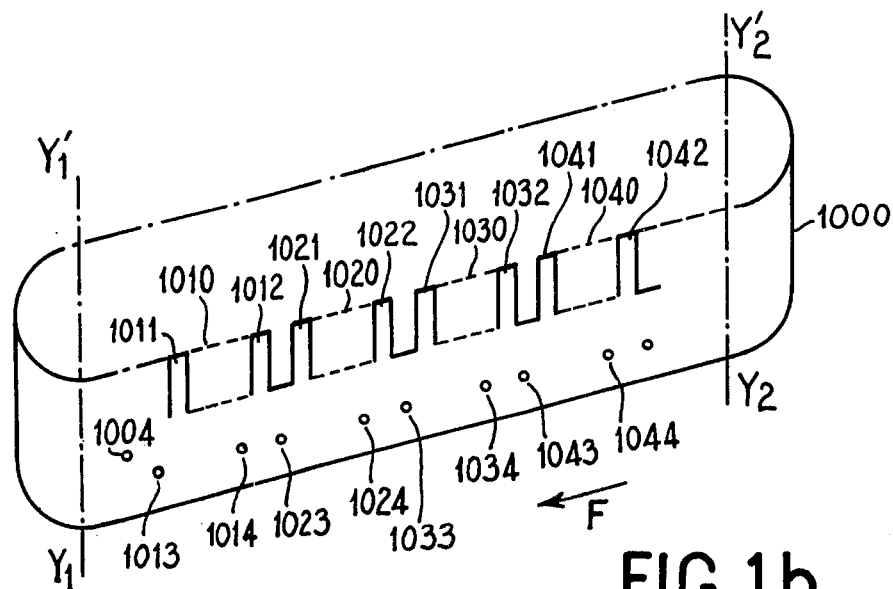

FIGS. 1a and 1b show a view in perspective and from the top of such a type-carrying band or tape 1000. Band or tape 1000 is mounted in a printing machine on two pulleys 1001A and 1001B, the axes Y1-Y′1 and Y2-Y′2 of which are vertical. The band or tape 1000 includes a certain number of small tongues which carry characters (480 in this embodiment) grouped into 10 identical sets of characters, four of which 1010, 1020, 1030, 1040 are shown in FIG. 1b.

Each one of those sets is represented by its first and by its last small tongue, the latter being separated by broken lines. Thus set 1010 is represented by its first and last small tongues 1011 and 1012, set 1020 by its small tongues 1021 and 1022, set 1030 by its small tongues 1031 and 1032, set 1040 by its small tongues 1041 and 1042, etc.. The small tongues are intentionally shown over-sized with respect to the band or tape 1000, so as to make FIG. 1b clearer.

In the same manner, a given number of hammers 1150 to 1155 have been represented in a very schematic manner in FIG. 1a. Band or tape 1000, which is endless, runs in a linear manner at a constant speed between hammers 1150 to 1155 on one side, and a writing support 1002 and a fixed anvil 1003 on the other side.

The speed of band or tape 1000 is adjustable, and it depends on the printing speed required for the printing machine. Small tongues 1011 – 1012, 1021 – 1022, 1031 – 1032, 1041 – 1042 correspond to synchronization holes 1013 – 1014, 1023 – 1024, 1033 – 1034, and 1043 – 1044, respectively, so that to each small tongue there corresponds a single synchronization hole or perforation.

When the band or tape runs in the direction indicated by arrow F, hole or perforation 1013 is associated with small tongue 1011, perforation 1014 with small tongue 1012 and so forth.

The type- or character-carrying tape 1000 has a special synchronization perforation called "perforation of the beginning of the tape" 1004 located at a level different from the alignment of the synchronization perforations.

With the alignment of the synchronization perforations, there is associated a collector C1 called a synchronization collector (not represented), which delivers an impulse L N S every time a synchronization perforation runs in front of it.

With the "beginning of the tape" perforation 1004 there is associated a collector C2 (not represented), which delivers an impulse when said perforation 1004 runs in front of it.

The use of the two signals sent by the collectors C1 and C2 makes possible, through suitable known circuits, the instantaneous location of all of the synchronization perforations and, therefore, of all of the small tongues. Taking into account the known relative geometrical arrangement of the collectors, hammers and small tongues, the relative location of each hammer and character-carrying small tongue is always known.

In order to simplify the explanation, it will be assumed that the band or tape 1000 contains 480 characters distributed into 10 identical sets or 48 characters and that the printing machine contains 160 hammers also distributed into 10 sets of 16 hammers each.

Figure 1C:
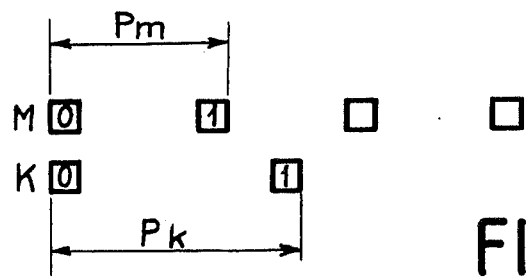
FIG. 1c is a schematic, top view of the relative pitch of the print hammers and characters of the machine illustrated in connection with FIGS. 1a and 1b.

As shown in FIG. 1c, the pitch of the hammers Pm is different from, and narrower than the pitch of the characters Pk. Therefore, at a given point in time, only a certain number of hammers are in coincidence with the characters. In the case being described, Pk/Pm = 16/13.

Figure 2:
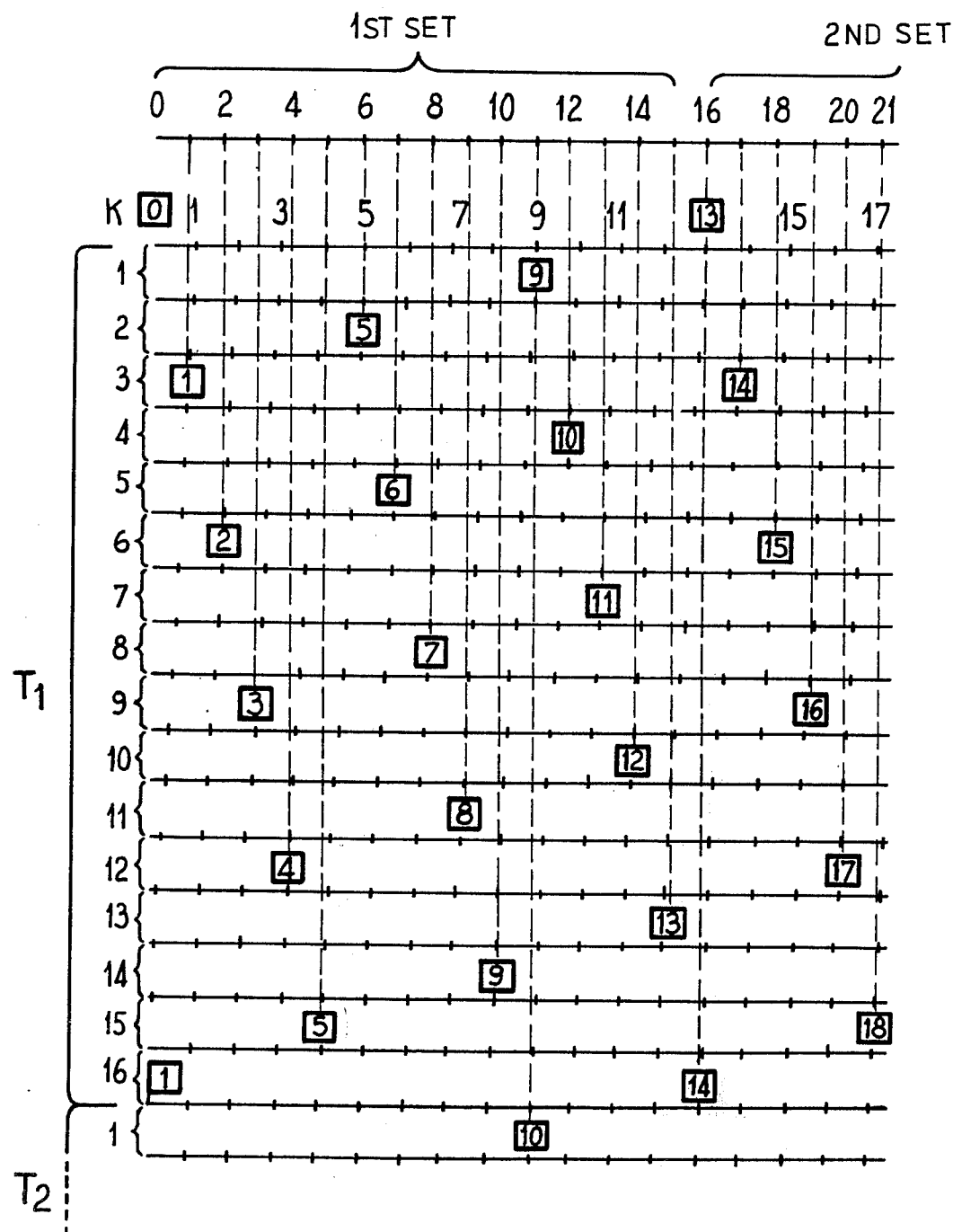
FIG. 2 is a partial schematic representation of the respective positions of the characters on the moving tape and the print hammers.

The partial table in FIG. 2 shows the positions of the characters on the moving tape with respect to the row of hammers. If the first hammer 0 of the first set of hammers coincides, at a given point in time, with the character having rank 0, hammer 16 (first hammer of the second set), coincides with the character having rank 13, hammer 32 coincides with the character having rank 26, and so forth.

As the tape moves at a constant speed in front of the hammers, there is designated, by cycle, the time period which separates the coincidences with the same hammer of two characters which follow each other on the tape. In FIG. 2, the cycle is time T, which elapses between the successive coincidences of the characters having rank 0 and rank 1 with hammer 0. There are also defined sub-cycles or time intervals between two successive hits of two hammers, in a number equal to that of the hammers of a set, corresponding to the various coincidences of the hammers of a set with certain characters. As a result there are 10 simultaneous coincidences in the course of one sub-cycle (as there is one coincidence per sub-cycle and per set of hammers). FIG. 2 represents all of the coincidences which occur in the course of a cycle T1, from the instant when the character having rank 0 is located facing a hammer having rank 0. The numbers of those characters which are in coincidence with the hammers are framed; the numbers of the sub-cycles are placed facing the brackets near the left-hand column.

At the beginning of the first sub-cycle, character 0 faces hammer 0, at the beginning of the second sub-cycle, character 9 faces hammer 11, at the beginning of the third sub-cycles, character 5 faces hammer 6, and so forth.

It will be noted, that all of the characters from 0 to 13 inclusive, are at least once in a position where they face a hammer of the first set during cycle T1. In addition, the character having rank 5 successively faces hammers 6 and 5, and character 9 successively faces hammers 11 and 10. It is also necessary to observe that the order of location of the characters on the tape does not correspond to the order of succession of the sub-cycles in which the coincidences are taking place.

FIG. 3 is a table of the numerical order of the hammers of the first, second and tenth sets M1, M2 ... M10, arranged in that order, and of the numerical order of the characters k which are in coincidence at the beginning of each one of the 16 sub-cycles of the first, second ... forty-eighth cycles T1, T2 ... T48.

That table is interpreted in the following manner: hammer 0 of the first set M1 can hit in the course of the first sub-cycle of cycles T1, T2 ... T48, in succession the characters having rank 0, 1, 47, and so on; hammer 16 can hit in the course of the first sub-cycle of the same cycles: the characters having rank 13, 14 ... 60, and so forth. Hammer 32, in the course of the first sub-cycle of the same cycles can hit in succession the characters having rank 26, 27 ... 73 and so forth. The first hammer 144 of the tenth set can hit in succession, in the course of the first sub-cycles of cycles T1, T2 ... T48, the characters having rank 117, 118 ... 165.

At the beginning of each one of the 16 sub-cycles of a cycle, there are 10 possible simultaneous hits of the hammers of the same order in the 10 sets, and in the course of a cycle, 16 series of 10 simultaneous hits, that is to say 160 hits which correspond to the sum of the hits of one character by each of the hammers of the ten sets. In order to print one line of paper, it is necessary for each one of the hammers to be able to hit one of the 48 different characters of one of the 10 identical sets, something which requires a maximum duration of 48 cycles, or of 768 sub-cycles at most. That is the reason why the forty-eighth cycle T48 has been shown in FIG. 3.

Figure 4:
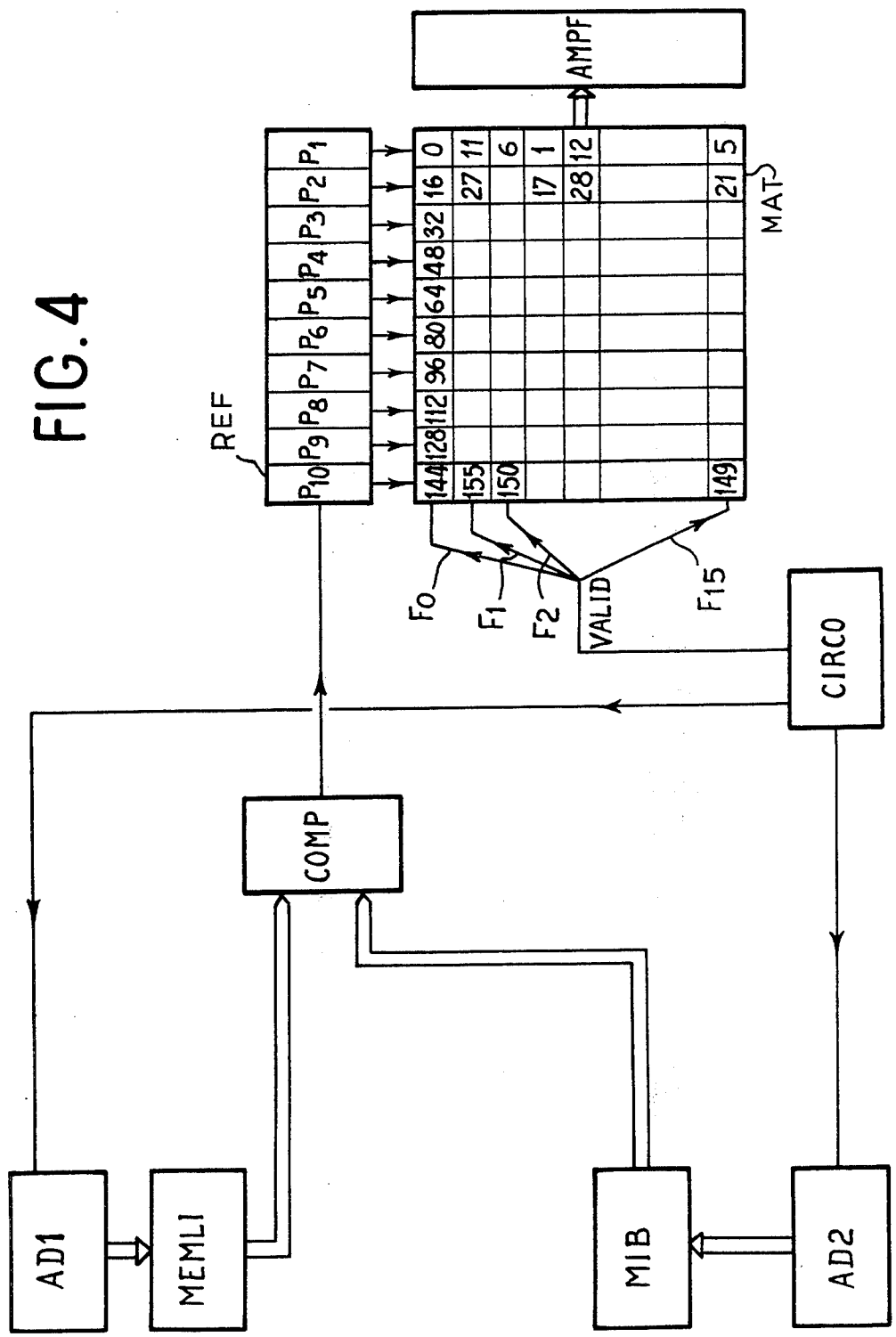
FIG. 4 is a block-diagram of a preferred form of control device according to the present invention.

FIG. 4 shows a controlling device which satisfies the above-described conditions which have been illustrated by the Tables in FIGS. 2 and 3.

The essential constituting elements of the controlling device are:

the memory which gives the image of the type- or character-carrying tape, memory M I B.

the line memory M E M L I.

the addressing circuit A D 2 of memory M I B.

the addressing circuit A D 1 of the memory M E M L I.

the comparing device C O M P.

the hitting register R E F.

the hitting controlling matrix M A T.

the complex formed by the hitting amplifiers of the hammers A M P F.

the counting circuit C I R C O.

The operation of the controlling device will be described during cycle T1, it being understood that the functioning of the controlling device is identical from one cycle to the other, and from one printing line to the other.

Memory M E M L I contains the coded characters to be printed by each one of the 160 hammers. That content is renewed before the printing of each line of printing by the central unit of the information processing system to which the printing machine is attached. The arrangement of those characters is done in the order of the hammers which are in simultaneous coincidence during the 16 successive sub-cycles of a cycle (See Tables 2 and 3). Memory M E M L I is addressed by circuit A D 1 which makes possible access to all of the coded characters the memory contains in the order of character classification.

Memory M I B contains the different coded characters of the character-carrying tape arranged in their order on that tape, and it is filled with these characters every time the printing machine is placed under tension. Memory M I B is addressed by addressing circuit A D 2 which enables access to all of the coded characters of memory M I B in the order of the characters in simultaneous coincidence for each one of the 16 successive sub-cycles.

The two memories are connected to the two inputs of comparing device C O M P, which performs, in the course of each sub-cycle, a succession of 10 comparisons of the content of the two memories, character by character. The positive or negative results are transmitted to register R E F.

Once the series of 10 comparisons has been completed, the register R E F transmits the result of those comparisons to the controlling matrix for hitting, M A T, which is validated by the counting circuit C I R C O. The latter, in the course of each one of the 16 sub-cycles of a cycle, makes it possible for the matrix M A T to transfer the result of the comparisons to the extension hitting elements A M P F of the 10 hammers which are in coincidence. Depending on the positive or negative result of the comparisons, the hammers are or are not operated. Counting circuit C I R C O also sends to addressing circuits A D 1 and A D 2 signals which enable them to address their respective memories M E M L I and M I B in synchronism, sub-cycle by sub-cycle. Counting circuit C I R C O therefore is performing an essential function.

Figure 5:
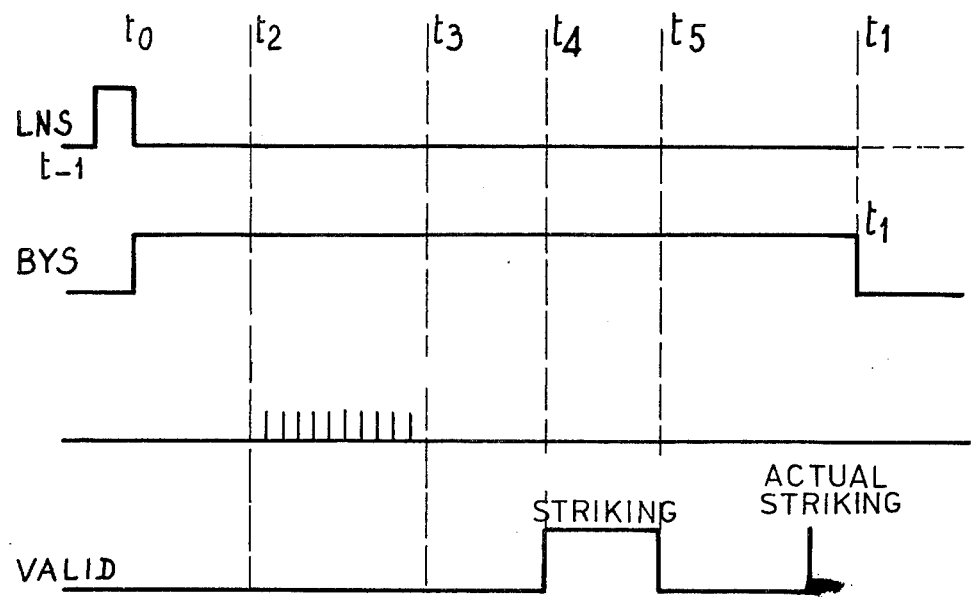
FIG. 5 illustrates the functioning of the control device in the form of a chronogram.

At the beginning of each cycle T1 to T48, the controlling device sends an impulse L.N.S. (see FIG. 5) to addressing circuit A D 2. That impulse falls to a logical zero state at time t; also at time $t\, o$, circuit C I R C O delivers an impulse called B Y S which switches to a logical 1 state, and falls to a logical zero state at instant $t1$. The time interval ($t1 - t0$) defines the duration of a sub-cycle. Impulse B Y S also is sent to addressing circuit A D 2.

During each sub-cycle (during the time when impulse B Y S is at logical 1), starting with instant $t2$, and up to instant $t3$, circuit C I R C O sends a series of 10 I M P impulses to addressing circuit A D 1 of the line memory M E M L I. Starting with instant $t4$ and up until instant $t5$, the C I R C O circuit validates the hitting of the 10 hammers which are in coincidence, by means of the V A L I D signal sent to the hitting matrix M A T.

The M E M L I memory is a memory which contains as many locations, i.e., zones, as there are hammers, that is to say 160 in the present case. Each location may contain a 9 bit word (8 data bits + 1 parity bit).

The arrangement of the words in that memory, which is determined by the central unit of information processor, is done according to the chronological order of the hammers in coincidence during the 16 sub-cycles, as shown in the Table in FIG. 6.

In that table, there have been made to appear on each horizontal line, the 10 numbers of the hammers in coincidence for each sub-cycle of a given cycle. There are 16 lines which each correspond to one of the sub-cycles SC0 ... to SC15. Thus, at sub-cycle SC0 the hammers 1, 16, 32, 48, 64, 80, 96, 112, 128 and 144 are in coincidence; at sub-cycle SC1, hammers 11, 27, 43, 59, 75, 91, 107, 123, 139 and 155 are in coincidence; and at sub-cycle SC15, hammers 5, 21, 37, 53, 69, 85, 101, 117, 133, and 149 are in coincidence. However, it is clear that, in each one of the 160 zones of the line memory M E M L I, the central unit arranges (ranks) the character which must be hit by the corresponding hammer. Thus, still with reference to FIG. 6, there is placed in the first zone the character to be printed by hammer having rank 0, in the second zone the character to be printed by the hammer having rank 16, in the third zone, the character to be printed by the hammer having rank 32 (line 1, sub-cycle SC0), etc ...

The addressing circuit A D 1 of the memory M E M L I is implemented by a simple counting device. The latter receives, by sub-cycle, the train of 10 I M P impulses, and it moves forward one unit for each impulse received, then indicating the order number of the zone of the M E M L I memory the content of which must be sent into the comparing device C O M P. Thus, in the course of the first sub-cycle SC0 of a given cycle, the counting device will indicate at the first impulse the order number 0, that is to say, the character to be printed by the hammer 0 will be transmitted to the comparing device C O M P (FIG. 6). At the second I M P impulse received, the counting device will indicate the order number 1, that is to say, the character to be printed by the hammer having rank 16 will be transmitted to comparing device C O M P, and so forth, up to the tenth impulse of the first sub-cycle SC0.

During the second sub-cycle SC1, at the first impulse I M P which is received, counting device A D 1 indicates the zone having the order number 11, that is to say, that the character to be printed by the hammer having rank 11 must be sent into comparing device C O M P. The same procedure continues up to the last one of the ten impulses I M P of sub-cycles SC15, when the counting device indicates the order number 149, that is to say, the character to be printed by the hammer having rank 149 must be sent into comparing device C O M P.

The image memory of the type of character-carrying tape, memory M I B, contains 240 memory locations which each may contain a 9 bit word, (8 data bits plus 1 parity bit.) The number of locations is equal to the number of characters contained on a character-carrying half-tape, which is sufficient since tape (1000) may be divided into two symmetrical half-tapes. The words are arranged in the M I B memory in the order they occupy on a character-carrying tape, but the addressing of memory M I B by addressing circuit A D 2 is done as a function of the coincidences in the order equivalent to the order of the hammers simultaneously in coincidence for the various sub-cycles SC0 to SC15 of a cycle. The Table in FIG. 6 represents the order in which the characters are addressed during the first cycle T1.

In order better to understand the functioning of the addressing circuit A D 2, it is necessary, from the Table in FIG. 7, to establish an addressing law of the M I B memory. To that end, the first sub-cycle S C O is considered. The characters which have to be addressed are in the order 0, 13, 26, . . . 91, 104, 117. The change from one character to the next is done by adding + 13, and the same is true for each one of the sub-cycles under consideration. The problem is more complex when passing from the address of the 10th compared character of a sub-cycle, to that of the first compared character of the next sub-cycle. Let us take, for example, the case of passing from the first sub-cycle SC0 to the second sub-cycle S C 1 (SC0 to SC1), the change is then made from address 117 to address 9: to obtain that result, there is added to 117 the quantity 2 × 13, that is to say, 26.

143 is then obtained, which is added to 106, the result being 249.

The difference between 249 and 240 is equal to 9, which is really the address of the character which has to be compared first at the time of the second cycle.

Let us now consider the passage from the second sub-cycle SC1 to the third sub-cycle SC2: we go from address 126 to address 5.

We add 126 + 13 = 139 then 139 + 106 = 245, 245 − 240 = 5

Let us consider as a third example, the passage from sub-cycle SC2 to sub-cycles SC3 (from address 122 to address 1)

122 + 13 = 135
135 + 106 = 241
241 − 240 = 1

As a general rule, after the tenth comparison, if A is the address of the compared character, we compute:

A + 13 = A' and there is calculated the sum (A' = 106) modulo 240

In a few special cases (of which the first example, above is (A' + 106) > 240, + 13 are still added to A' + 106, and there is computed the sum modulo 240 of that new number. Thoses cases occur at the end of the sub-cycles SC0, SC3, SC6, SC9, SC12.

The Addresses being expressed in an 8 bit code, the maximum address (A + 106) which can be inscribed is equal to $2^8$, equals 256.

It is therefore necessary to examine the case in which A' + 106 > than 256. In that case, the sum S' found is (A' + 106) modulo 256. Now, we need S (A' + 106) modulo 240. We have S = 16. It is therefore necessary, as a result, to add 16 to the sum S' found when (A' + 106) > 256. (In that case there is computed a sum (A' + 106) modulo 256 − 16).

Figure 8:
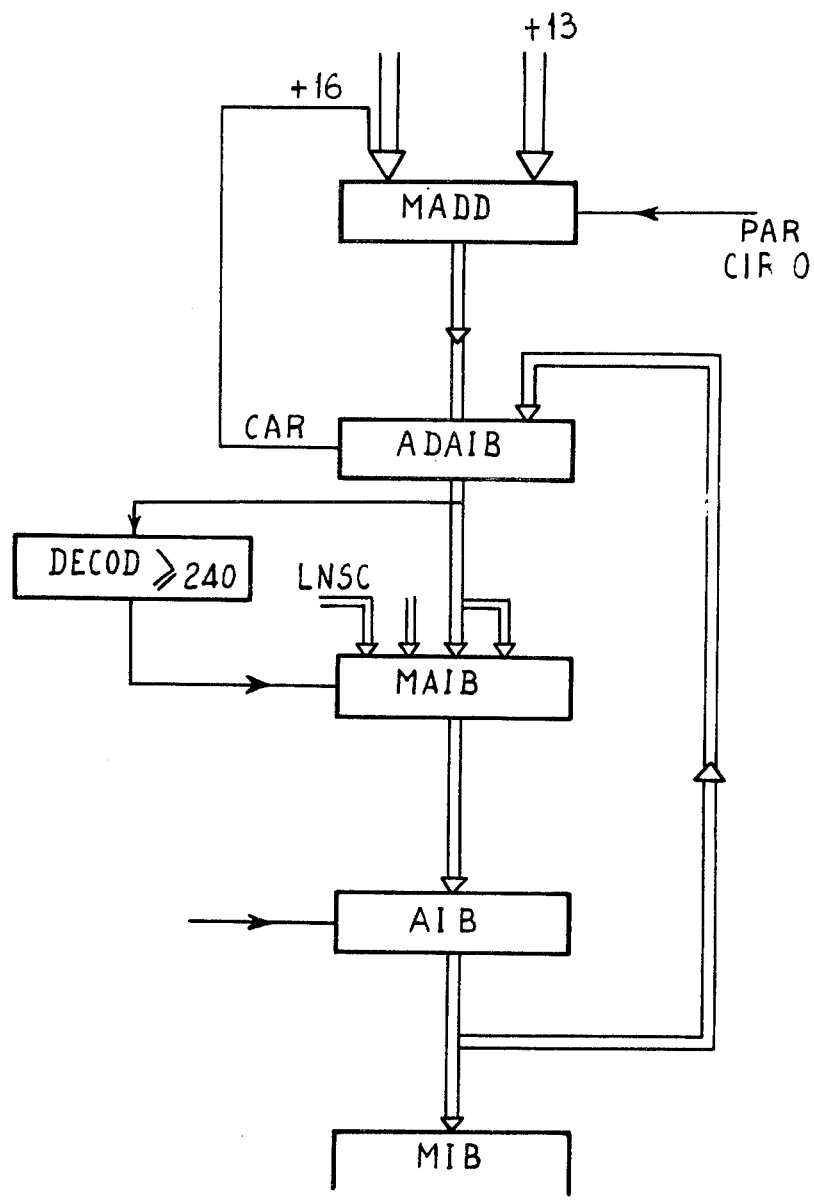
FIG. 8 is a block-diagram of the addressing circuit of the band-image memory.

The addressing circuit A D 2 is represented in more detail in FIG. 8, where there appear the main elements which constitute it. Those are:

the multiplexing device MADD
the adding device A D A I B
the multiplexing device M A I B
the address register A I B
the decoding device D E C O D Multiplexing device M A D D makes it possible to validate the transfer toward the adding device A D A I B of one of the three numbers 13, 106 or 106 + 16. It is piloted by the counting circuit C I R C O.

Between the instants $t2$ and $t3$ of each sub-cycle SC0 to SC15, the circuit C I R C O makes possible the validation by M A D D of the transfer toward A D A I B of the number + 13 as many times as there are comparisons.

Between the instants $t3$ and $t4$, for sub-cycles SC0, SC3, SC6, SC9, SC12, circuit C I R C O makes possible the validation by M A D D of the transmission toward A D A I B of twice the number + 13 then of once the number + 106.

For the other sub-cycles, the multiplexing device M A D D transmits between those same instants, once the number + 13, then once the number 106.

The adding device A D A I B receives the addresses A transmitted by the address register A I B and the numbers transmitted by multiplexing device M A D D. It executes the following operations:

1. In the course of each one of sub-cycles SC0 to SC15; 10 times the addition A + 13 (between instants $t2$ and $t3$).

2. In the course of sub-cycles SC0, SC3, SC6, SC9, SC12, once the addition A' = A + (2 × 13), and once the addition A' + 106 (instants $t3$ to $t4$).

3. In the course of the other sub-cycles, once the addition A' = A + 13, then the addition A' + 106 (instants $t3$ to $t4$).

When A' + 106 is > 256, the adding device A D I B sends the carry over bit to the multiplexing device M A D D so that the same will transmit + 16 to the adding device A D A I B, which in that case has calculated the sum S= (A' + 106 + 16) modulo (256 − 16).

Multiplexing device M A I B performs the transfer toward address register A I B of the following addresses:

1. At the beginning of each cycle T (sub-cycle SC0, first comparison) the number of the address of the character which is in a position facing number 0, by means of signal L.N.S.C. coming from circuit C I R C O.

2. Transmission of the address calculated by adding device A D A I B.

When that address is 240, decoding device D E C O D signals it to multiplexing device M A I B, which then transmits the sum S= (A' + 106) modulo 240, and that in the following manner to register A I B.

It is known that we have

240 = 0 × 256 + 1 × 128 + 1 × 64 + 1 × 32 + 1 × 16 + 0 × 8 + 0 × 4 + 0 × 2 + × 1.

It can therefore be seen that the modulo 240 sum of a number higher than or equal to 240 (and lower than 256) is constituted by the sum of the four lowest weights - the multiplexing device therefore in that case will select the lowest four weights from the number transmitted by the adding device A D A I B.

The address register transmits to memory M I B, in a permanent manner, the address of the character which must be compared.

Comparing device C O M P performs one-by-one, during each sub-cycle, 10 comparisons from among the bits of information coming from memories M I B and M E M L I. When the result of the comparison is positive, the comparing device sends to register R E F a bit equal to logical 1. In the opposite case, the content of the register is equal to logical zero.

Register R E F includes 10 positions P1 to P10, each one receiving in the course of each sub-cycle the result of one of the ten comparisons. Thus position P1 receives the result of the first comparison, position P2 that of the second one, etc..

The result of those comparisons is transmitted by positions P1 to P10, simultaneously to hitting (striking) matrix M A T.

The connections of matrix M A T are established in a manner such that, as it may be seen in FIG. 4, position P1 will be connected in parallel with 16 striking extensions of striking hammers 0, 11, 6, 1, 12, 7, . . . 5; position P2 to 16 hammer amplifiers 16, 27, 22, 17, 28 . . . 21; position P10 to 16 hammer extensions 144, 155 . . . 149.

The counting circuit C I R C O is connected by means of the 16 conductors F0 to F15 to the striking extensions of hammers 0, 16, 32 . . . 144 (for F0), in coincidence during the first sub-cycle SC0, to striking amplifiers of hammers 11, 27 . . . 155 (for F1) in coincidence during the second sub-cycle SC1, to extensions of hammers 6, 22 . . . 150 (for F2), in coincidence during the third sub-cycle SC2, etc.

Figure 9:
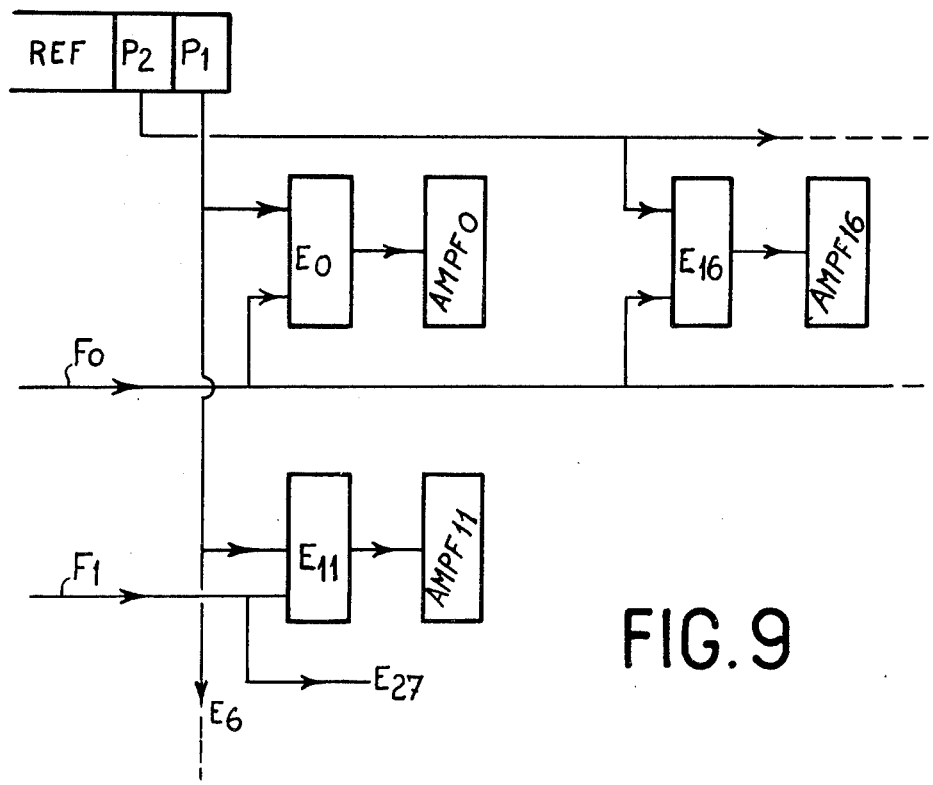
FIG. 9 is a block-diagram of the hitting control matrix.

FIG. 9 illustrates the manner in which Matrix M A T is connected to Register R E F. Position P1 of said register is connected to AND gate E0 which itself is connected to the amplifier of hammer 0.

Position 2 P2 is connected to AND gate E16 which is connected to striking amplifier AMPF16 of hammer 16. Conductor F0 is connected to AND gates E0, E16 . . . E144, respectively.

Moreover, position P1 is connected to AND gates E11, E6, E1, E12 . . . E5 which themselves are connected to striking amplifiers AMPF11, AMPF6, AMPF1, AMPF12 . . . AMPF5 of hammers 11, 6, 1, 12 . . . 15. In the same manner, conductor F1 is connected to AND gates ETE11, E27 . . . E155 (See also FIG. 4).

Matrix M A T and the striking amplifiers function as follows during cycle T and its first sub-cycle SC0.

The counting circuit C I R C O sends on conductor F0 an impulse equal to the logical 1 to the ten gates E0, E16, E32 . . . E144.

Simultaneously, each one of the positions P1 to P10 of the striking register REF sends the information it contains to the same gates E0, E16, E32 . . . E144. When that information is equal to the logical one (positive comparison), the corresponding gate then validates the striking amplifier associated with it. The latter operates the corresponding hammer. It is evident that the above described functioning is identical for the other sub-cycles SC1 to SC15 of cycle T.

Figure 10:
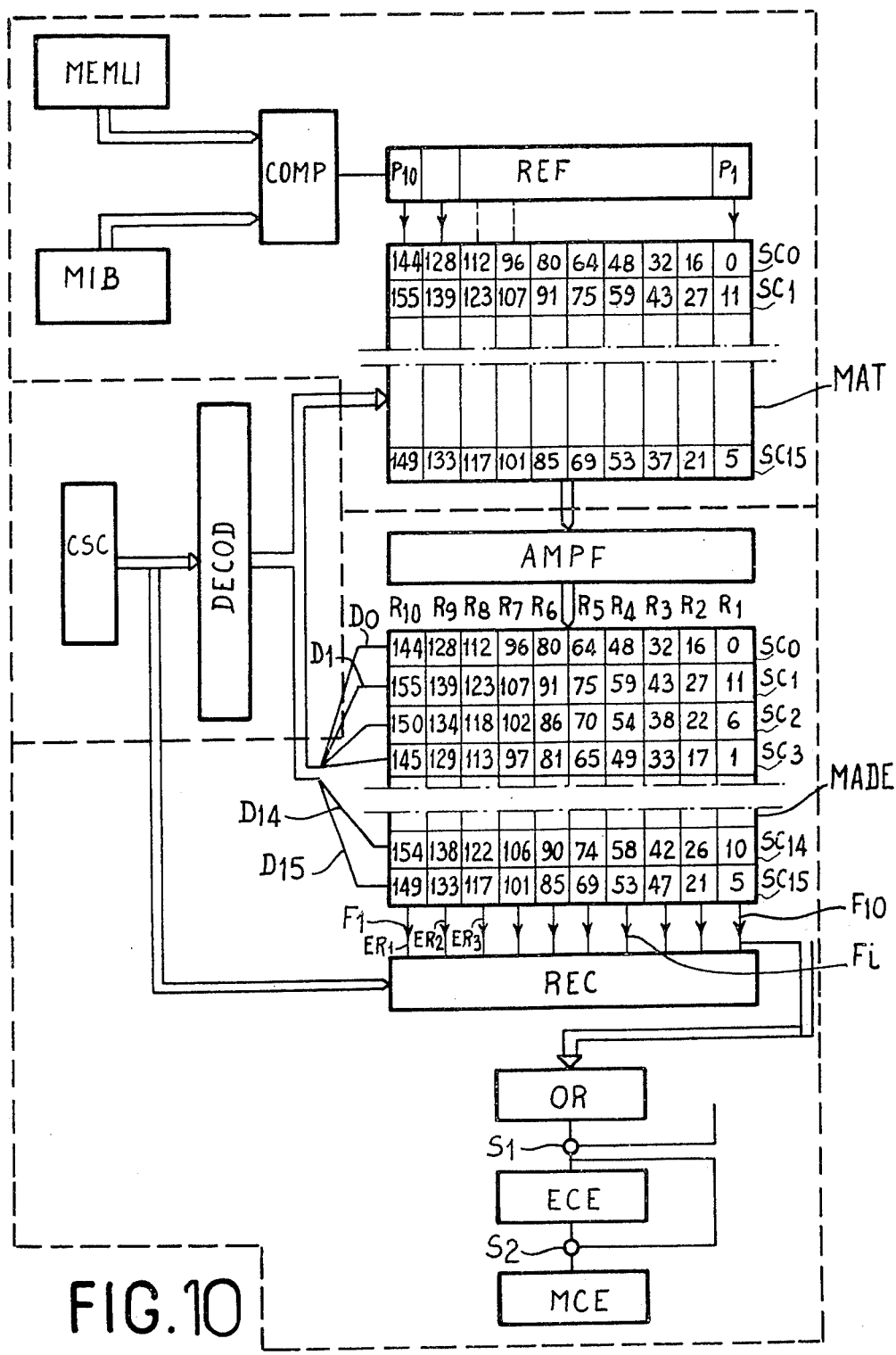
FIG. 10 is a block-diagram of a preferred form of the present invention shown in connection with an exemplary device for controlling the operation of print hammers similar to the device shown in FIG. 4.

FIG. 10 illustrates novel error detection circuitry in combination with print control circuitry similar to the like-lettered and like-numbered circuitry shown in FIG. 4. In certain instances wherein the circuits of FIGS. 4 and 10 are the same, the circuits illustrated in FIG. 4 are not illustrated in FIG. 10.

The FIG. 10 circuitry comprises:

a line store, i.e., memory MEMLI which contains, in coded form, the characters to be printed by each of the one hundred and sixty hammers, the characters being arranged in the same order as that in which the simultaneous coincidences on the part of the hammers take place in the sixteen successive sub-cycles in a cycle. The store MEMLI is addressed by AD1 in such a way that MEMLI allows access to all the coded characters which it contains in the order in which they are arranged;

a store, i.e., memory, MIB which forms an image of the type-carrying belt. MIB contains the various characters on the belt arranged in the same order as they are on the belt. It is addressed by AD2 which allows access to all the coded characters which MIB contains in the same order as that in which characters are in simultaneous coincidence in each of the sixteen successive sub-cycles;

a comparator COMP having two inputs connected to be responsive to the outputs of stores MIB and MEMLI; during each sub-cycle COMP carries out a succession of ten comparisons between the contents of the stores, character by character.

The negative or positive results of the comparisons are transmitted to register REF. When the series of ten comparisons has been completed, register REF transmits the comparisons to the strike-control matrix MAT which is validated by a selection counting circuit of which only the sub-cycle counter CSC and the decoder DECOD are shown. Counter CSC is similar to counter CIRCO shown in FIG. 4.

In the course of each of the sixteen sub-cycles SC0 to SC15, decoder DECOD allows matrix MAT to transmit the results of the comparisons to ten of the 160 strike amplifiers AMPF (similar to FIG. 9) for the ten coinciding hammers. The hammers are or are not actuated depending on whether the result of the comparisons is positive or negative.

Within matrix MAT there are shown, for some of the sub-cycles SC0 to SC15, the hammers which coincide during the sixteen sub-cycles. Thus, in the first sub-cycle SC0, it is hammers 0, 16, 32, 48, 64, 80, 96, 112, 128, 144, which coincide, in sub-cycle SC1 it is hammers 11, 27, 43, 59, 75, 91, 107, 123, 139, 155, and so on up to sub-cycles SC15 in which it is hammers 5, 21, 37, 53, 69, 85, 101, 117, 133, 149. Since register REF has ten locations P1 to P10, it can be seen that if, for example, the comparison result at P1 is positive, in the first sub-cycle it will be the strike amplifier for hammer 0 (e.g., AMPF 0, FIG. 9) which is actuated, then in the second sub-cycle the amplifier for hammer 11 (AMPF 11) and so on. If the result at P5 is positive it will be amplifier 64 which is actuated in the first sub-cycle SC0, then amplifier 75 in the second SC1, etc.

Once the printing operation has been carried out, it is well to know whether the strike amplifiers have in fact been actuated and, if not, which have not operated. The print checking arrangement according to the invention is responsible for fulfilling this function. In FIG. 10 are shown the main constituent parts of an embodiment of the invention, namely, in addition to the counter CSC and the decoder DECOD already mentioned:

the error detection matrix MADE which has ten columns and sixteen rows, i.e., one hundred and sixty locations, one of which is provided for, and is responsible to, each of the 160 AMPF amplifiers, the error register REC which is connected to counter CSC and to decoder DECOD, the error indicating flip-flop ECE, flip-flop MCE.

Each of the one hundred and sixty strike amplifiers AMPF has a detector for detecting operating errors. This latter may be a decoder which detects when the amplifier fails to operate after having received an order from the strike-control device. It may also be a detector for detecting short-circuits in the amplifier, such a short-circuit causing the hammer in question to strike at the wrong time.

It will be assumed in what follows that the error detector is of the first type which generates an error signal when its associated amplifier operates erroneously. To this end, a preferred embodiment of one error detector and strike amplifier is illustrated in FIG. 12.

Figure 12:
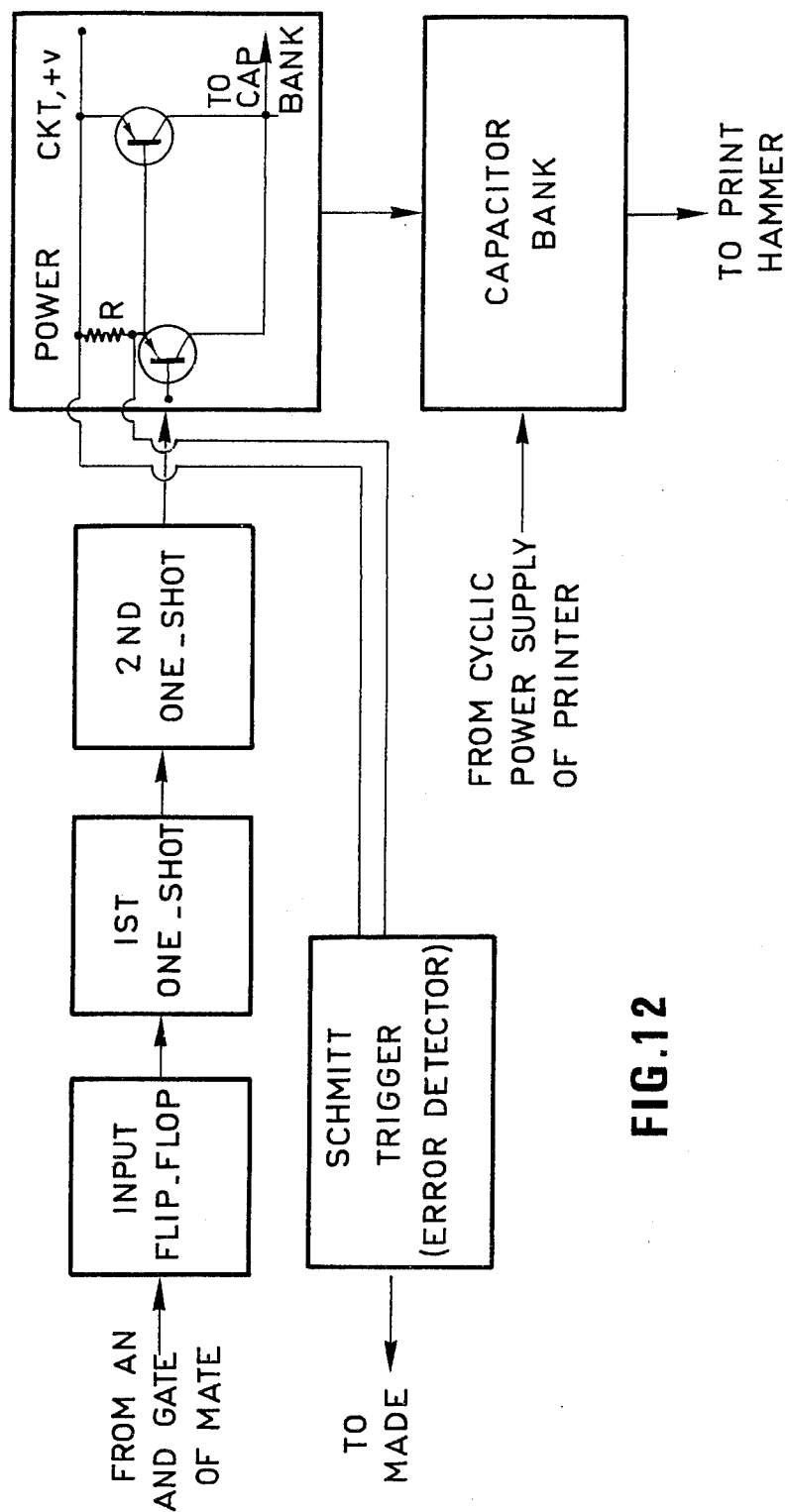
FIG. 12 is a partial block, partial circuit diagram of a preferred embodiment of a strike amplifier and detector utilized in the system of FIG. 10.

As it can be seen, from FIG. 12, each of the 160 strike amplifiers of FIGS. 9 and 10 comprises a cascaded arrangement of:

an input flip-flop,
a first one-shot, a second one-shot,
a power circuit, and
a capacitor bank supplying strike energy.

Each input flip-flop is controlled by a strike control signal derived from one AND gate of the hitting control matrix MAT. AND gates corresponding to each of the strike amplifiers, i.e., AND gates E0, E16 . . . E144 respectively supply input signals to the input flip-flops of AMPFs AMPF0, AMPF16 . . . AMPF 144, etc. In response to a strike control signal being derived from an AND gate to which an input flip-flop is connected, the flip-flop changes from 0 to 1 to trigger the first ONE-SHOT of the strike amplifier. In response to the first ONE-SHOT timing out, the second ONE-SHOT is triggered to a high state by the trailing edge of the pulse derived from the ONE-SHOT going low. While the second ONE-SHOT is in a high state, it acts on the power circuit so that a completed low impedance path is provided for the energy stored in a charged capacitor bank. Included in the low impedance path is the coil for a print hammer which is thereby energized in response to the power circuit being activated by the high state of the second ONE-SHOT. The capacitor bank stores energy supplied, for instance, by a cyclic supply of the printer. In a particular example of the invention, the power circuit is a well-known power transistor Darlington circuit, such as the MJ 3001 Darlington circuit manufactured by Motorola that includes emitter resistor R.

A detector circuit is provided to determine if the print hammer is energized in response to the input flip-flop receiving a strike control signal. The detector circuit is composed of a classical Schmitt trigger controlled by the voltage difference between the terminals of the emitter resistor R of power transistor Q1 of the Darlington circuit. When no current flows in resistor R, it means that the strike amplifier failed to operate. Thereby, the Schmitt trigger goes high and supplies an input pulse to a corresponding location of error detection matrix MADE.

Each of the one hundred and sixty locations in matrix MADE is connected to the Schmitt trigger error detector of the corresponding strike amplifier AMPF. The sixteen rows in the matrix MADE are responsive to output lines D0 to D15 from decoder DECOD and each of ten colums R1 to R10 of matrix MADE are connected in parallel to drive one location in the error register REC via lines F1 to F10 and the input of error indicating flip-flop ECE through the OR circuit Register REC is also connected to be responsive to the four parallel outputs of counter CSC.

The principle of operation of the arrangement according to the invention is as follows: it was seen above that one hammer among the one hundred and sixty was ordered to strike by taking the number of one sub-cycle of sixteen and one of the locations from the ten in strike register REF. Similarly, and conversely, if one knows the number of one sub-cycle of sixteen and one faulty strike amplifier among ten, it is possible to discover which of the one hundred and sixty amplifiers is involved. (This is clearly apparent from the table shown in FIG. 10 in the error detection matrix MADE). It is for this reason that the row and column configuration adopted for matrix MADE is exactly the same as that for matrix MAT, as can be seen from the table entered in the said matrix in FIG. 10. Matrix MADE contains ten columns R1 to R10 equivalent to columns P1 to P10 in matrix MAT, and sixteen rows equivalent to sub-cycles SC0 to SC15. The numbers shown in matrix MADE are the numbers of the detectors, which are in a one-for-one relationship with the one hundred and sixty strike amplifiers.

The above-described arrangement operates as follows:

Once the printing of a line of print has been completed (some time after the end of printing), if matrix MADE has detected an error in one Ri (between R1 and R10) of the ten columns during a sub-cycle SCi (between SC0 and SC15), it emits along line Fi a pulse ERi which is transmitted on the one hand to register REC and on the other to the OR circuit. Register REC records the number of the column Ri and the number SCi of the sub-cycle. During this time, the OR circuit is transmitting pulse ERi to flip-flop ECE. If validating condition S1 is satisfied, meaning that printing of the line of print is complete, pulse ERi causes flip-flop ECE to change state. If a second error is detected in column Ri (condition Si), flip-flop ECE changes the state of flip-flop MCE but the number of the appropriate strike amplifier cannot be recorded in register REC.

Figure 11:
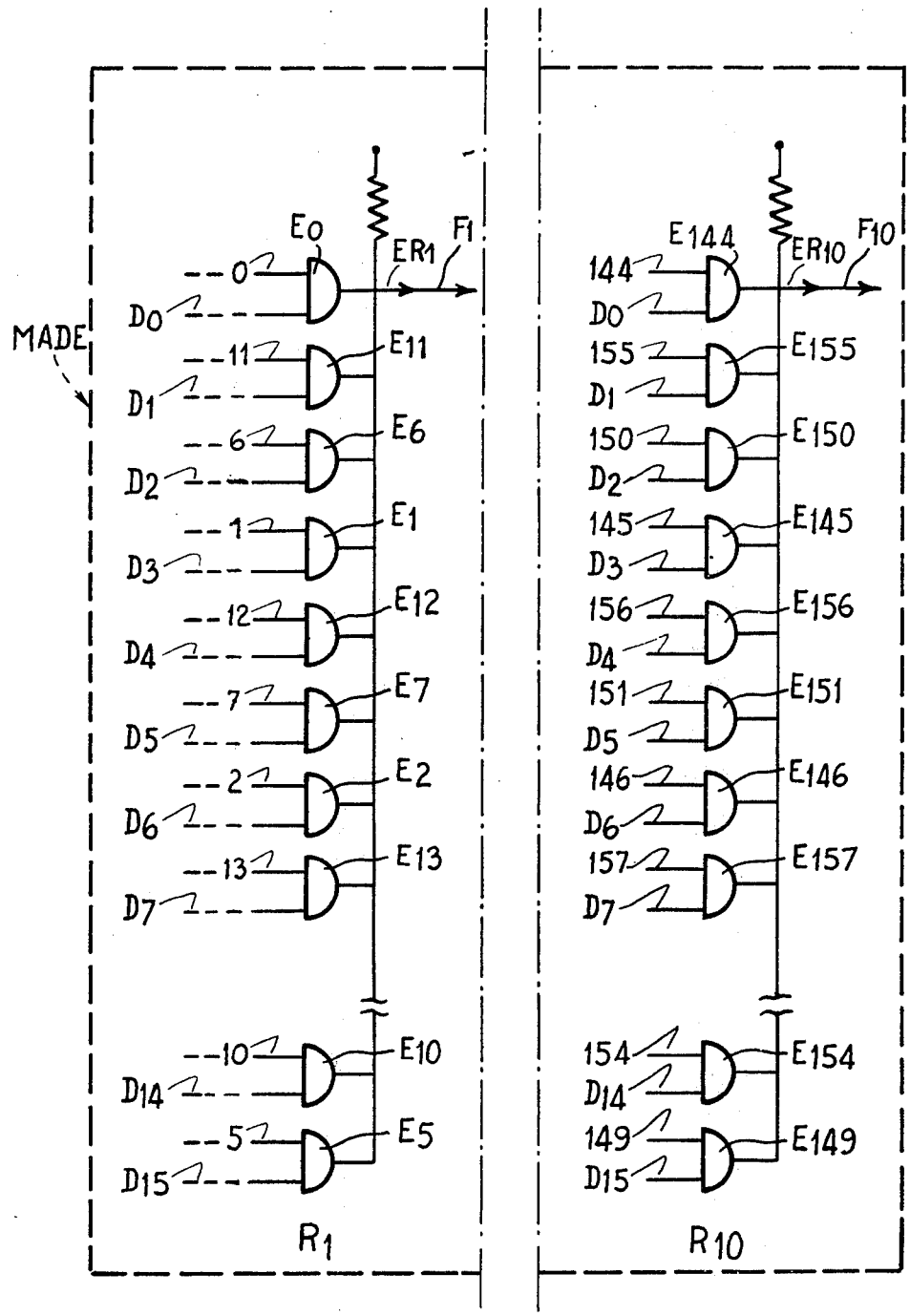
FIG. 11 is a logic block-diagram showing a preferred form of matrix made in accordance with the present invention.

FIG. 11 shows how matrix MADE is made up.

The matrix contains as many "AND" circuits or gates as there are strike amplifiers (and thus hammers). These AND circuits are grouped into columns (see FIG. 1 also). In FIG. 11 are shown only segments of the first and last columns R1 and R10.

Column R1 contains AND circuits marked E0, E11, E6, E1, E12, E7, E2, E13 . . . E10, E5, these corresponding to the stike amplifiers for hammers 0, 11, 6, 1, 12, 7, 2, 13, . . . 10, 5 respectively.

Column R10 contains AND circuits marked E144, E155, E150, . . . E154, E149 which correspond to the strike amplifiers for hammers 144, 155, 150 . . . 154, 149 respectively. Each AND circuit has two inputs, the first being connected to the Schmitt trigger error detector for the corresponding strike amplifier and the second input being connected to one of the sixteen outputs D0 to D16 of the decoder DECOD. The outputs of the AND circuits in any one column are connected together at a common output formed by one of the lines F1 to F10. Thus, the common output of the AND circuits in column R1 is formed by line F1. When an error is detected in one of the amplifiers in a column, for example amplifier 12 in column R1 in sub-cycle SC4, circuit E12 receives an error pulse at its first input and a pulse at its second input from line D4 and therefore transmits an error pulse along line F4 which is directed to register REC and to the OR circuit.

In a modified embodiment of the invention, register REC is made up of two eight-location registers, the first register being connected location by location to the eight lines F1 to F8, and the second register having two locations connected to the lines F9 and F10, two unoccupied locations, and four locations which indicate the number of the sub-cycle SCi.

When the printer forms part of a data-processing system, once printing of the print line has been concluded, the peripheral monitor reads the state of flip-flops ECE and MCE and, if they have changed state, goes on to read register REC.

What is claimed is:

1. Apparatus for checking the operation of N control circuits, each including detector means for generating an error signal in response to erroneous operation, the control circuits being divided into $m$ groups with k control circuits in each group, said apparatus comprising:

N gate means for transmitting an error signal when enabled;

first conductor means for operatively connecting each detector means to a different gate means so that the gate means are divided into $m$ groups with $k$ gates in each group;

first selection means for individually enabling a different one of the $m$ groups of control circuits and the gates connected to the detector means of the enabled control circuits during $m$ sub-cycles of operation;

second selection means for selecting for operation during each sub-cycle not more than $k$ control circuits; and error indicator means for receiving error signals transmitted by the gate means when enabled by the first selection means and for indicating the erroneous operation of one or more of the control circuits.

2. Apparatus, as claimed in claim 1, wherein the error indicator means comprises an error register including at least $k$ storage elements so that the erroneous control circuit in each group of $k$ control circuits can be identified.

3. Apparatus, as claimed in claim 2, wherein the gate means are connected together in $m$ rows and $k$ columns, wherein each of the $m$ rows is connected to the first selection means, and wherein each of the columns is connected to a different one of the $k$ storage elements of the error register.

4. Apparatus, as claimed in claim 3, and further comprising means for storing in the error register the number of each sub-cycle during which an error signal is generated by the detection means.

5. Apparatus, as claimed in claim 1, wherein the control circuits comprise strike amplifiers in a printer having a linear character-support which moves at constant speed past a row of N hammers the spacing of which is different from that of the characters so that, when a print line is being printed, $k$ simultaneous coincidences between characters and hammers take place periodically in a succession of sub-cycles and, in the course of $m$ consecutive sub-cycles, each of the N hammers coincides once with a character, a cycle being defined as the time which elapses between the coincidence of two characters which follow one another on the same support with the same hammer.

6. Apparatus, as claimed in claim 5, wherein the linear character-support comprises an endless type-bearing belt which is tensioned over two pulleys.

7. Apparatus, as claimed in claim 5 in which the detector means comprises a short-circuit detector.

8. Apparatus, as claimed in claim 1 in which the error indicator means comprises flip-flop circuitry.

* * * * *